US009030842B2

(12) United States Patent
Schwulst

(10) Patent No.: US 9,030,842 B2
(45) Date of Patent: May 12, 2015

(54) SEALED OVERMOLDED CIRCUIT BOARD WITH SENSOR SEAL AND EDGE CONNECTOR SEAL AND PRODUCTION METHOD OF THE SAME

(75) Inventor: Kyle E. E. Schwulst, Whitmore Lake, MI (US)

(73) Assignee: Electrojet, Inc. MI (US)

( * ) Notice: Subject to any disclaimer, the term of this patent is extended or adjusted under 35 U.S.C. 154(b) by 831 days.

(21) Appl. No.: 13/241,377

(22) Filed: Sep. 23, 2011

(65) Prior Publication Data

US 2013/0077264 A1 Mar. 28, 2013

(51) Int. Cl.
H02B 1/20 (2006.01)
H05K 5/00 (2006.01)
H05K 3/28 (2006.01)
G01P 1/02 (2006.01)

(52) U.S. Cl.
CPC .............. *H05K 5/0034* (2013.01); *H05K 3/284* (2013.01); *H05K 2201/10151* (2013.01); *G01P 1/023* (2013.01); *G01P 1/026* (2013.01); *H01L 2924/0002* (2013.01)

(58) Field of Classification Search
USPC .......... 361/688, 690, 708, 752, 826; 439/722, 439/736
See application file for complete search history.

(56) References Cited

U.S. PATENT DOCUMENTS

| 5,257,172 | A | 10/1993 | Erickson |
| 6,779,260 | B1 | 8/2004 | Brandenburg et al. |
| 6,804,997 | B1 | 10/2004 | Schwulst |
| 6,955,081 | B2 | 10/2005 | Schwulst |
| 7,151,674 | B2 * | 12/2006 | Sasaki et al. .................. 361/752 |
| 7,225,793 | B2 | 6/2007 | Schwulst et al. |
| 7,514,784 | B2 | 4/2009 | Mayuzumi et al. |
| 7,553,680 | B2 | 6/2009 | Brandenburg et al. |
| 7,739,791 | B2 | 6/2010 | Brandenburg et al. |
| 2010/0117308 | A1 | 5/2010 | Dell'Eva et al. |

FOREIGN PATENT DOCUMENTS

GB 507440 6/1939
KR 20070063858 A 6/2007

* cited by examiner

Primary Examiner — Robert J Hoffberg
Assistant Examiner — Hung Dang
(74) Attorney, Agent, or Firm — Brooks Kushman P.C.

(57) ABSTRACT

An electronic apparatus partially overmolded with a overmold sealing material that seals the circuit board, protects the electrical components on the circuit board and provides seals between the circuit board and mating devices is disclosed. The electronic apparatus may be an engine controller. The electrical components may be an electrical edge connector, a sensor, and a heat sink. The sensor may be a pressure sensor. The controller may be connected to a throttle body such that the overmold sealing material provides a first seal between the controller and the throttle body allowing the pressure sensor to be in fluid communication with the interior of the throttle body. A wire harness may be connected to the controller such that the overmold sealing material provides a second seal between the wire harness and the controller protecting the electrical connection. The overmold sealing material may also be translucent.

14 Claims, 3 Drawing Sheets

SEALED OVERMOLDED CIRCUIT BOARD WITH SENSOR SEAL AND EDGE CONNECTOR SEAL AND PRODUCTION METHOD OF THE SAME

BACKGROUND

1. Field

The invention relates to an overmolded electronic circuit board, and in particular, an engine controller wherein the overmold material encapsulates the circuit board providing protection for the electronics on the circuit board and providing the seals between the circuit board and mating components.

2. Background Art

Electronic modules, such as printed circuit boards used as engine controllers, cannot be used in harsh environments without protecting the modules. Circuitry and electronic componentry attached to the circuit boards must be protected from water and contaminants which can short the circuitry and cause issues with the proper function of the electronic componentry. As well, circuit boards must be protected from the high temperatures radiating from engines which can also cause damage to the circuit boards. For these reasons, engine controllers are typically placed in a less harsh environment away from the engine with wiring running from the engine controller to the other components needed to run and control the engine.

Some techniques have been developed to seal engine controller circuit boards by encapsulating the circuit board and electronic componentry on the circuit board in a rigid resin material. The rigid material requires additional seals, or additional complex precautions, to allow areas of the board to extend past the resin. O-rings and other seals are used in order to ensure that the circuit board is protected when connecting wiring to the controller. The rigid resin material also causes issues as the resin material insulates and the circuitry and electronic componentry attached to the board can be damaged by overheating during use.

Sensors used to measure engine parameters must be placed in close proximity to the engine components in order to measure the parameter. Due to this, sensors are typically mounted on, or within, engine components with wiring sending the data measured to the engine controller. Excessive wiring adds expense, potential snag/cut failures, and creates a less desirable appearance of the entire engine system.

Examples of engine controllers using a pressure sensor to control the engine operating parameters may be found in U.S. Pat. Nos. 6,804,997 B1 and 6,955,081 B2 to Schwulst, and 7,225,793 B2 to Schwulst et al., all of which are hereby incorporated by reference in their entirety.

The following references were considered in conjunction with preparing this application: U.S. Pat. No. 7,514,784 B2 to Mayuzumi et al., U.S. Pat. Nos. 7,739,791 B2, 7,553,680 B2, and 6,779,260 B1 to Brandenburg et al., U.S. P.G. Pub. No. 2010/0117308 A1 to Dell'Eva et al., K.R. Pub. No. 10-2007-0063858 to Ha et al., U.S. Pat. No. 5,257,172 to Erickson and G.B. Pub. No. 507,440 to Long.

SUMMARY

A need therefore exists for an engine controller system that has a circuit board which may be placed in the harsh environment close to the, thus reducing its wiring complexity and cost, while at the same time allowing heat to dissipate from its circuitry.

A circuit board encapsulated by an overmold sealing material is disclosed. In one embodiment the overmolded circuit board is an engine controller utilized in an engine control system. The controller circuit board has a first side, a second side, and an elongate edge extending between the first and second side. The elongated edge with an adjacent portion of the first and second sides defines a connector region. An electrical contact array is disposed on the connector region, a pressure sensor is disposed on the first side of the circuit board, and circuit board circuitry connects the electrical array to the pressure sensor. The overmold sealing material is partially disposed around the controller which covers and seals the circuit board circuitry, but does not cover the electrical contact array or the pressure sensor.

In some embodiments, the overmolded circuit board is connected directly to a throttle body. The throttle body defines an interior region, an exterior, and a pressure passage extending between the interior region and the exterior. The pressure sensor disposed on the first side of the circuit board is aligned with the passage extending into the interior region and is in fluid connection with the interior region of the throttle body. The overmold sealing material provides a first seal between the circuit board and the throttle body so that the pressure sensor is in exclusive fluid communication with the interior of the throttle body. The overmold sealing material ensures that the pressure sensor is able to make an accurate measurement of the pressure in the interior of the throttle body by keeping out moisture and debris from the surround environment, as well as keeping in the pressurized air-fuel mixture from the interior of the throttle body.

In other embodiments, a wiring harness is connected directly to the circuit board. The wiring harness has a wire connector disposed on one end of the wiring harness. The wire connector defines a connector surface and a connector electrical contact array. The electrical contact array of the wire connector contacts the electrical contact array of the circuit board and is in electrical connection with the circuit board circuitry. The overmold sealing material provides a second seal between the connector surface of the wire connector and the connector region of the circuit board. The overmold sealing material ensures that the wiring harness maintains a substantially contaminant free environment when connected to the circuit board.

The connector surface of the wire connector defines a connector profile and the overmold sealing material near the connector region of the circuit board defines a corresponding connector profile. When the wire connector is connected to the circuit board, the connector profile of the wire connector and the corresponding connector profile of the overmold sealing material cooperate to provide an interference fit and frictionally couple the wire connector to the controller.

In another embodiment, the connector surface of the wire connector defines a unidirectional connector profile, and the overmold sealing material near the connector region of the circuit board defines a corresponding unidirectional connector profile. The unidirectional connector profile of the wire connector and the corresponding unidirectional connector profile of the overmold sealing material cooperate to provide a single connecting direction of the wire connector to the controller ensuring the connector electrical contact array and circuit board electrical contact array are connected with aligning polarity. The unidirectional connector profiles only allow the wire connector to be connected to the circuit board in a single orientation, thus the wire connector cannot be connected in such a way as to reverse the polarity of the electrical contact arrays.

In a further embodiment, an elastomeric securing strap is used to secure the wire connector to the controller. The strap may be integral with the wire harness and wrap around the overmolded circuit board. The strap may be integral with circuit board and wrap around the wire harness. The strap may have loops that hook protrusions from the wire harness, the circuit board, or both.

In yet other embodiments, a heat sink is disposed on the circuit board of the controller, such that a portion of the heat sink is not covered by the overmold sealing material. Since the overmold sealing material may have insulative properties, it is preferable to have the heat sink protrude from the overmold to allow more optimized heat transfer from the heat sink to the surrounding environment. It is envisioned, however, that a light film of the overmold material could cover the heat sink and the heat sink could provide heat dissipation through the overmold sealing material.

A light emitting device may disposed on the circuit board, and the overmold sealing material may be translucent. Thus when the translucent overmold sealing material is disposed over the light emitting device, the light emitted from the light emitting device may pass through the overmold sealing material.

The circuit board may also define a hole that passes through the circuit board from the first side to the second side. The hole allows the overmold sealing material to flow through the hole during the overmolding process which will reduce debonding of the overmold sealing material from the circuit board once cured.

In an alternate embodiment, a general electronic apparatus surrounded by a polymeric material is disclosed. The electronic apparatus is a circuit board having circuitry with an electrical edge connector, a sensor, and a heat sink all in cooperation with the circuitry. The polymeric material surrounds a portion of the circuit board to protect the circuitry, while allowing the electrical edge connector, the sensor, and the heat sink to properly function. It is envisioned that the polymeric material may cover the electrical edge connector, the sensor and the heat sink.

In some alternate embodiments, the polymeric material surrounding the sensor defines a first seal, and the circuit board may be used with a device having a measurable parameter. In this embodiment, the first seal cooperates with the device to provide a substantially contaminant free environment between the sensor and the measurable parameter.

The sensor may be a pressure sensor, and the polymeric material surrounding the pressure sensor may define the first seal. The first seal allows for the circuit board to be used with a device containing a medium with a pressure, such that the first seal may cooperate with the device to ensure an exclusive fluid communication between the pressure sensor and the medium.

In other alternate embodiments, the polymeric material near the electrical edge connector defines a second seal. In this embodiment, a wire connector is connectable to the circuit board, and the second seal may cooperate with the wire connector to provide protection of the electrical edge connector from the surrounding environment.

In yet further embodiments, an emitter may be disposed on the circuit board. The emitter may protrude past the polymeric material, or the emitter may be covered by the polymeric material. If the emitter is covered by the polymeric material, the emitter is designed to emit a signal through the polymeric material. The emitter may emit a signal capable of being transmitted through an opaque material, such as a radio frequency wave. The emitter may emit a signal capable of being transmitted through a translucent material, such as light emitted from a light emitting diode. The signals emitted may be control signals sent to other componentry, diagnostic signals capable of being received by diagnostic equipment, or informational signals pertaining to the operation of the electronic apparatus.

A method of manufacturing a water-resistant engine control system is also disclosed. The method comprises the steps of fabricating a circuit board with circuitry, populating the circuit board with an edge connector, a pressure sensor and a heat sink all in connection with the circuitry, and overmolding a water-resistant material around a portion of the circuit board. The water-resistant material is overmolded in such a way as to seal the engine control circuitry while providing that the edge connector, pressure sensor and heat sink remain functional. It is preferred that the water-resistant material not cover the edge connector, pressure sensor, or heat sink, however it is also envisioned that all three components may be covered by the water-resistant material and still be functional. The edge connectors may use conductive charging and electrical transfer when separated by the water-resistant material. The pressure sensor may be placed in a vacuum or constant pressure cavity such that the water-resistant material acts as a baffle to transmit pressure fluctuations when covered by the water-resistant material. The water-resistant material may be designed such that the heat sink may pass heat though the water-resistant material to the outside environment when covered by the water-resistant material.

The method may include providing passage holes through the circuit board, and overmolding the water-resistant material around the circuit board and through the passage holes to provide debonding resistance.

The method may also include attaching the circuit board to a throttle body, aligning the pressure sensor such that it is in fluid communication with the interior of the throttle body, and utilizing the overmolded water-resistant material as a seal between the pressure sensor and the throttle body.

The method may also include attaching an edge connector socket of a wire connector to the edge connector of the circuit board, and utilizing the overmolded water-resistant material as a seal between the wire connector and the engine control module.

BRIEF DESCRIPTION OF THE DRAWINGS

Embodiments of the present invention described herein are recited with particularity in the appended claims. However, other features will become more apparent, and the embodiments may be best understood by referring to the following detailed description in conjunction with the accompanying drawings, in which:

DETAILED DESCRIPTION OF THE EMBODIMENTS

As required, detailed embodiments of the present invention are disclosed herein; however, it is to be understood that the disclosed embodiments are merely examples and that the invention may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1:
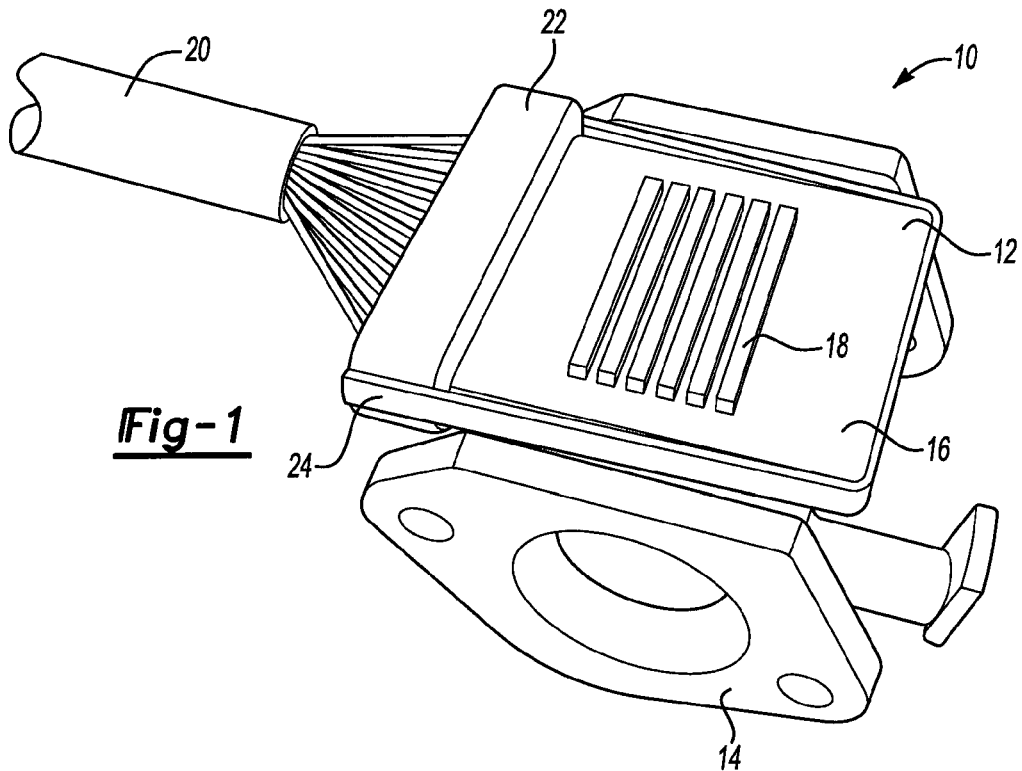
FIG. 1 is a perspective view of an engine control system with an engine controller having an overmold sealing material disposed around its circuit board; the engine controller being attached to a throttle body, and a wiring harness, being attached to the engine controller with an elastomeric securing strap wrapped around the periphery of the engine controller.

Referring to FIG. 1, an engine control system 10 is shown having an engine controller 12 connected to a throttle body 14. The controller 12 is an electronic apparatus that has an overmold sealing material 16 partially disposed around a circuit board (see FIG. 2). The overmold sealing material 16 is a polymeric material, such as an elastomer, plastic or thermoplastic. The overmold sealing material 16 has a suitable durometer, preferably, but not limited to, between 80 and 98 on a shore A scale using ASTM D2240-00 testing standard, to provide a suitable sealing surface between it and mating components. In the preferred embodiment, suitable materials may include Bostik® LPM 915, LPM 245, and LPM 917.

In this embodiment the overmold sealing material 16 is opaque and a portion of a heat sink 18 protrudes past the surface of the overmold sealing material 16. In other embodiments, the heat sink 18 may be covered (not shown) by the overmold sealing material 16. A wiring harness 20 is shown having a wire connector 22 connected to one end of the controller 12. An elastomeric securing strap 24 is wrapped around the periphery of the controller 12 to aid in securing the wire connector 22 to the controller 12. The overmold sealing material 16 provides protection for the controller 12 from water and other potentially damaging contaminants, as well as provides the seal at the interfaces between the controller 12 and the throttle body 14 and the controller 12 and the wire connector 22.

Figure 2:
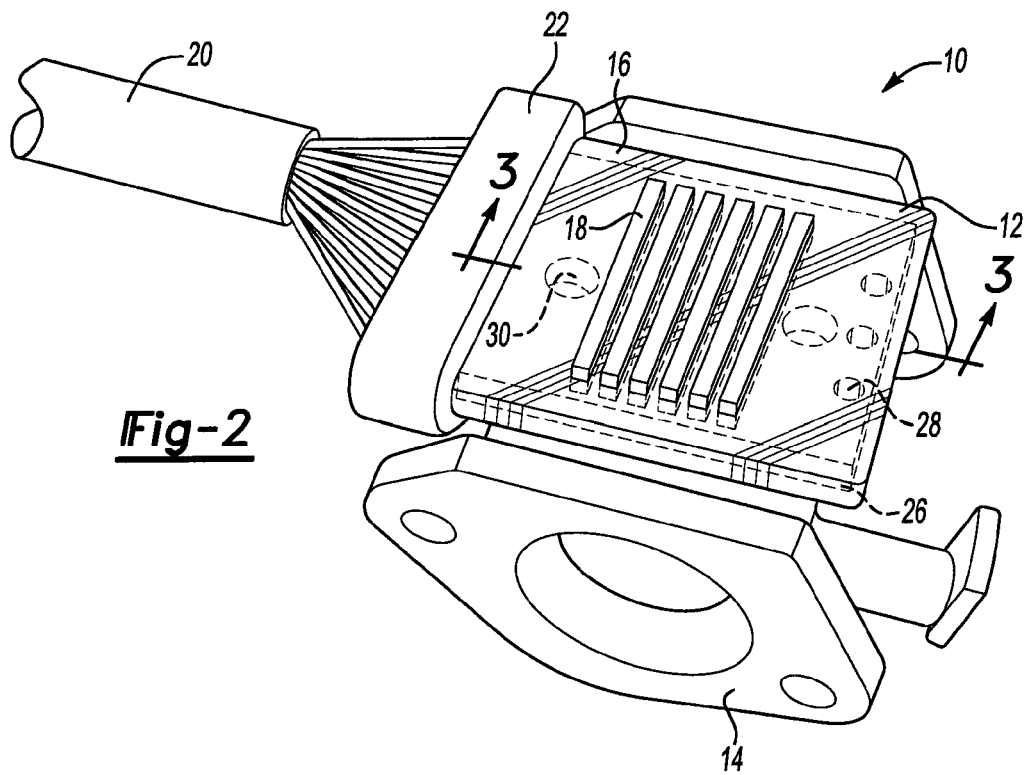
FIG. 2 is a perspective view of the engine control system with the engine controller attached to the throttle body and the wiring harness, wherein the overmold sealing material disposed around the circuit board is translucent.

Referring to FIG. 2, another embodiment of the engine control system 10 is shown. In this embodiment the overmold sealing material 16 disposed around the controller 12 is translucent. The circuit board 26 is shown inside the translucent overmold sealing material 16 with an emitter 28 and the heat sink 18 connected to the circuit board 26. In this embodiment, the emitter 28 is a LED (light emitting diode) which is covered by the translucent overmold sealing material 16 such that the light emitted from the LED may pass through the translucent overmold sealing material 16. In other embodiments, the LED protrudes through (not shown) the overmold sealing material 16. The emitter 28 may be covered by an opaque overmold sealing material 16 and emit non-light signals such as, but not limited to, radio frequency waves. In the preferred embodiment, the light signals indicate proper function of the engine controller.

In this embodiment, only a portion of the heat sink 18 is covered by the overmold sealing material 16 such that a portion of the heat sink 18 protrudes past the surface of the overmold sealing material 16. The figure also shows the circuit board 26 defining a hole 30 which the overmold sealing material 16 flows through to reduce debonding of the overmold sealing material 16 from the surfaces of the circuit board 12. The wire connector 22 of the wiring harness 20 is connected to the controller 12 and the controller 12 is connected to the throttle body 14 with the translucent overmold sealing material 16 providing the mating seals for the connections.

Figure 3:
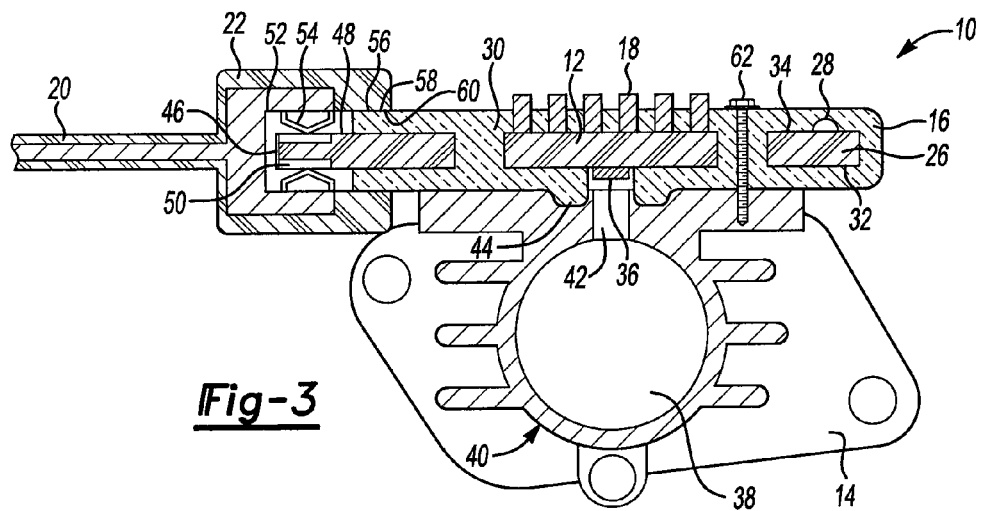
FIG. 3 is a cross-sectional view taken along line 3-3 in FIG. 2.

Referring to FIG. 3, a cross-sectional view taken along line 3-3 in FIG. 2 of the engine control system 10 is shown. The circuit board 26 has a first side 32 and a second side 34, with the heat sink 18 and the emitter 28 located on the second side 34, and a sensor 36 located on the first side 32. In this embodiment the sensor 36 is a pressure sensor and the controller 12 is connected to the throttle body 14, however, it is envisioned that the controller 12 may be an electronic apparatus attached to a device (not shown) other than a throttle body 14. The sensor may be any sensor suitable to measure a parameter of the device, such as, but are not limited to, a crank shaft position sensor, a throttle position sensor, a mass air flow sensor, a manifold absolute pressure sensor, an oxygen, a lambda sensor, a wheel speed sensor, and a temperature sensor.

In this embodiment, the controller 12 is connected directly to the throttle body 14 defining an interior region 38, an exterior 40, and a pressure passage 42 extending between the two. The pressure sensor 36 is in exclusive fluid communication with the interior region 38 of the throttle body 14 through the pressure passage 42, and the overmold sealing material 16 provides a first seal 44 between the controller 12 and the throttle body 14. The first seal 44 not only provides a water-resistant seal to protect the circuit board 26 from water ingress, the first seal 44 also provides a seal to prevent the fuel-air mixture inside the interior region 38 of the throttle body 14 from escaping. Although the pressure sensor 12 is shown not covered by the overmold sealing material 16, it is also envisioned that the overmold sealing material 16 could cover the pressure sensor and act as a baffle to transfer the pressure changes occurring within the throttle body 14. As well, other sensors may not require direct fluid communication with the device having a parameter to be measured and as such could also be covered by the overmold sealing material 16.

FIG. 3 also shows an elongate edge 46 extending between the first and second sides 32,34. The elongate edge 46 along with adjacent portions of the first and second sides 32,34 define a connector region 48 on the circuit board 26. An electrical contact array 50 is disposed on the connector region 48 providing a card-style edge connector. The wire connector 22 defines a connector surface 52 and a connector electrical contact array 54 on the connector surface 52 providing a card-style socket for receiving the card-style edge connector. The connector electrical contact array 54 is in electrical connection with the circuit board electrical contact array 50 and the overmold sealing material 16 provides a second seal 56 between the connector surface 52 of the wire connector 22 and the connector region 48 of the circuit board 26. Although the connector region 48 and the electrical contact array 50 are shown not covered by the overmold sealing material 16, it is also envisioned that the overmold sealing material 16 could cover either or both. The electrical connections could be provided through non-contact methods such as, but not limited to, inductive coupling using a magnetic field to transfer power and wireless communication to transfer engine control signals.

The connector surface 52 of the wire connector 22 also defines a connector profile 58 and the overmold sealing material 16 near the connector region 48 of the circuit board 26 defines a corresponding connector profile 60. The connector profile 58 of the wire connector 22 and the corresponding connector profile 60 of the overmold sealing material 16 cooperate to provide an interference fit and frictionally couple the two components together. The corresponding connector profiles 58,60 may have bumps or ramps and notches (not shown) that couple the wire harness 20 to the controller 12. The corresponding connector profiles 58,60 may also be keyed with a unidirectional connector profile to provide a single connecting direction of the wire connector 20 to the controller 12 ensuring the connector electrical contact array 54 and circuit board electrical contact array 50 are connected with aligning polarity.

The circuit board 26 may define holes 30 that pass through the circuit board 26 from the first side 32 to the second side 34. The overmold sealing material 16 may pass through the holes during the overmolding process. The overmold sealing material 16 cures into a substantially homogenous single unit, and the material passing through the holes 30 reduces the occurrence of debonding of the overmold sealing material 16 from the circuit board 26. The holes 30 may also be used to pass attachment hardware 62, such as bolts or screws, through the circuit board 26 to attach the electronic apparatus 12 to another device 14. The electronic apparatus 12 may also be attached to another device 14 with clips, adhesive, or other fasteners that do not pass through the holes 30.

Figure 4:
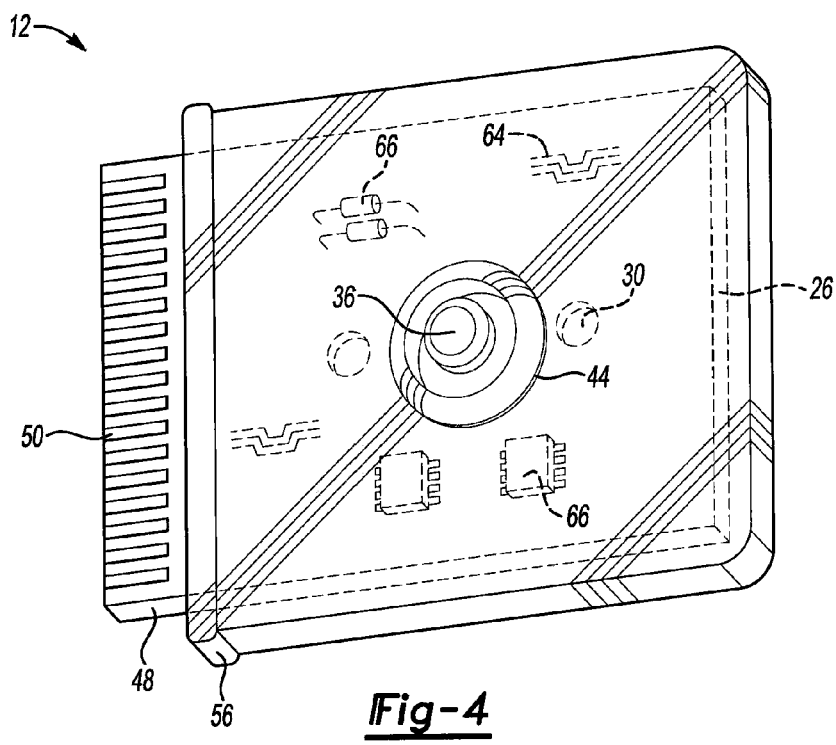
FIG. 4 is a perspective view of an electronic apparatus having a circuit board with circuitry, a sensor and a card-style edge connector populated on the circuit board, wherein a translucent overmold sealing material partially encapsulates the electronic apparatus.

Referring to FIG. 4, the electronic apparatus 12 having a circuit board 26 partially covered by the overmold sealing material 16 is shown from the first side 32. The overmold sealing material 16 is translucent showing the circuitry 64 and the card-style edge connector 50 of the circuit board 26. The circuitry 64 of the circuit board 26 provides electrical communication with all of the electrical components 66 populated on the circuit board 26 including the sensor 36. In this embodiment, the overmold sealing material 16 does not cover the sensor 36 or the connector region 48 with the card-style edge connector 50. The first seal 44 is shown surrounding the sensor 36 and the second seal 56 is shown adjacent to the connector region 48. It should be noted that the first and second seals 44,56 in FIG. 4 are illustrated extending outward from the surface of the overmold sealing material 16 to showcase the region upon which sealing may occur when connected to another device. In some embodiments, no profile change from the surface of the overmold sealing material 16 need occur for the seals to function, and the overmold sealing material 16 may cover the sensor 36 and edge connector 50 as described above.

Figure 5:
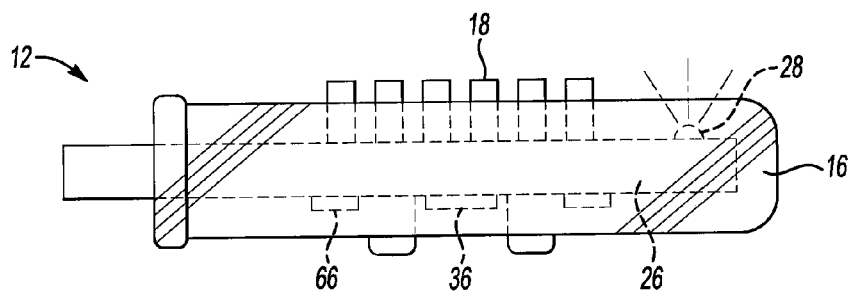
FIG. 5 is a side view of the electronic apparatus having the circuit board with circuitry, the sensor, the card-style edge connector, and a heat sink and an LED populated on the circuit board, wherein the translucent overmold sealing material partially encapsulates the electronic apparatus and light emitting from the LED is shown passing through the translucent overmold sealing material.

Referring to FIG. 5, the electronic apparatus 12 is shown with a translucent overmold sealing material 16 in which the circuit board 26 is fabricated and populated with the heat sink 18, the sensor 36, electrical components 66, and the LED 28. In this figure the LED 28 is transmitting visible light through the translucent overmold sealing material 16. The LED 28 may be used to send visible signals regarding the function of the electronic apparatus 12.

Figure 6:
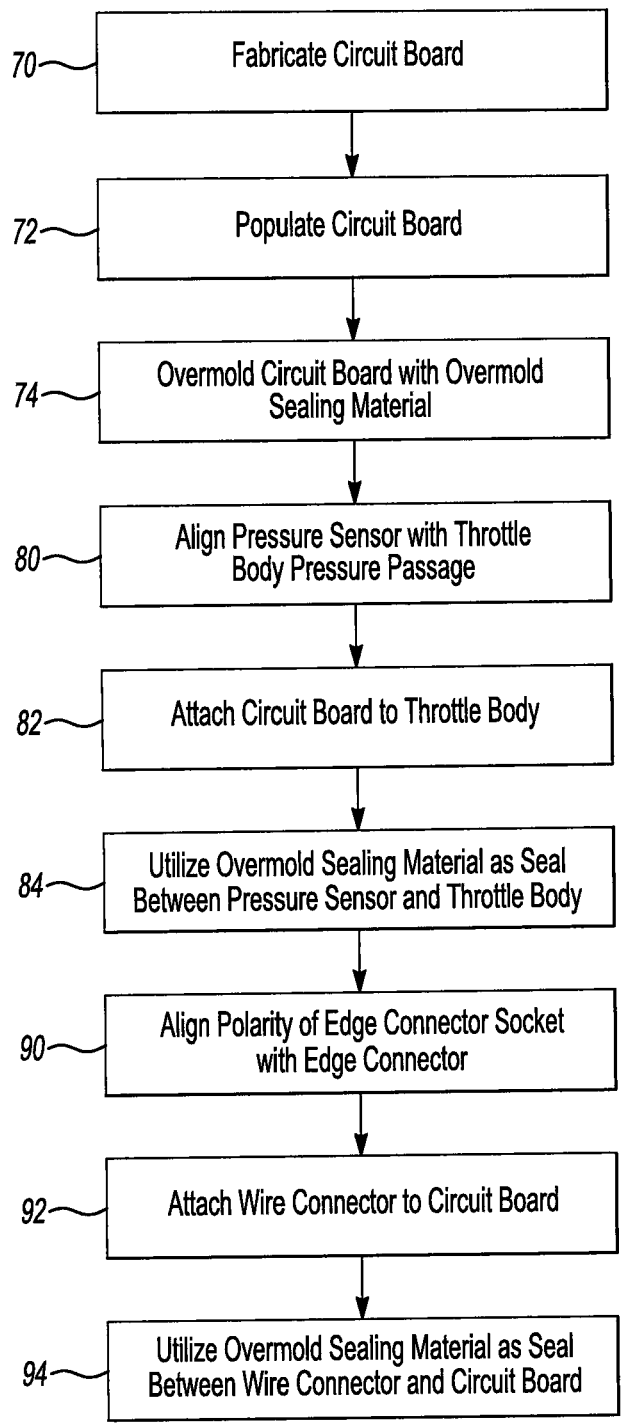
FIG. 6 is a block flow diagram of a method of manufacturing a water-resistant engine control system.

Referring to FIG. 6, a block flow diagram of a method of manufacturing a water-resistant engine control system is shown. The first step in the method is to fabricating a circuit board 70 which entails the providing of a circuit board substrate (see 26 in FIG. 4), fabrication of circuitry (see 64 in FIG. 4), and fabrication of an edge connector (see 50 in FIG. 4). This step may also entail the providing of passage holes through the circuit board substrate (see 30 in FIG. 4). The second step in the method is to populate the circuit board 72 which may entail the population of a pressure sensor (see 36 in FIG. 4), electrical components (see 66 in FIG. 4) and a heat sink (see 18 in FIG. 3), all of which may also be in connection with the circuitry. The third step in the manufacturing of the controller is to overmold a water-resistant material around a portion of the circuit board 74 such that the overmold sealing material seals the engine control circuitry while providing that the edge connector (see 50 in FIG. 3), pressure sensor (see 36 in FIG. 3) and heat sink (see 18 in FIG. 3) remain functional.

If passage holes through the circuit board substrate have been provided, then the when the overmolding of the water-resistant material occurs, a portion of the overmold material may pass through the passage holes to provide debonding resistance.

Additional steps to manufacturing a water-resistant engine control system include aligning the pressure sensor such that it is in fluid connection with the interior of the throttle body 80, attaching the circuit board to a throttle body 82, and utilizing the overmolded water-resistant material as a seal between the pressure sensor and the throttle body 84. As well as aligning the polarity of an edge connector socket with the polarity of the edge connector 90, attaching an edge connector socket of a wire connector to the edge connector of the circuit board 92, and utilizing the overmolded water-resistant material as a seal between the wire connector and the engine control module 94.

Although several embodiments of the invention have been disclosed, it will be apparent to persons skilled in the art that modifications may be made without departing from the scope of the invention. All such modifications and equivalents thereof are intended to be defined by the following claims.

What is claimed is:

1. An engine control system comprising:
a controller having a circuit board with a first side, a second side, and an elongate edge extending between the first and second sides, a section of which defining in combination with a portion of the adjacent first and second sides a connector region;
a circuit board electrical contact array disposed on the connector region;
a pressure sensor disposed on the first side of the circuit board;
an overmold sealing material partially disposed around the controller, wherein the overmold sealing material covers and seals the circuit board while not covering the electrical contact array and the pressure sensor; and
a throttle body defining an interior region, an exterior, and a pressure passage extending between the interior region and the exterior, wherein the pressure sensor is in fluid connection with the interior region of the throttle body through the pressure passage and the overmold sealing material provides a first seal between the pressure sensor and throttle body to maintain an exclusive fluid communication between the pressure sensor and the interior region of the throttle body.

2. The engine control system of claim 1, further comprising:
a wiring harness with a wire connector disposed on one end of the wiring harness, wherein the wire connector defines a connector surface and a connector electrical contact array, the connector electrical contact array is in electrical connection with the circuit board electrical contact array and the overmold sealing material provides a second seal between the connector surface of the wire connector and the connector region of the circuit board.

3. The engine control system of claim 2, wherein the connector surface of the wire connector defines a connector profile;
the overmold sealing material near the connector region of the circuit board defines a corresponding connector profile; and
the connector profile of the wire connector and the corresponding connector profile of the overmold sealing material cooperate to provide an interference fit and frictionally couple the wire connector to the controller.

4. The engine control system of claim 2, wherein the connector surface of the wire connector defines a unidirectional connector profile;
the overmold sealing material near the connector region of the circuit board defines a corresponding unidirectional connector profile; and
the unidirectional connector profile of the wire connector and the corresponding unidirectional connector profile of the overmold sealing material cooperate to provide a single connecting direction of the wire connector to the controller ensuring the connector electrical contact array and circuit board electrical contact array are connected with aligning polarity.

5. The engine control system of claim 2, further comprising:
an elastomeric securing strap associated with the wire connector which secures the wire connector to the controller.

6. The engine control system of claim 1, further comprising:
a heat sink disposed on the circuit board of the controller, such that a portion of the heat sink is not covered by the overmold sealing material.

7. The engine control system of claim 1, further comprising:
a light emitting device disposed on the circuit board.

8. The engine control system of claim 7, wherein the overmold sealing material is translucent, the overmold sealing material is disposed over the light emitting device, and the light emitted from the light emitting device passes through the overmold sealing material.

9. The engine control apparatus of claim 1, wherein the circuit board defines a hole that passes through the circuit board from the first side to the second side, and the overmold sealing material is disposed within the hole while covering and sealing the circuit board to reduce debonding.

10. An electronic apparatus comprising:
a circuit board with circuitry;
an electrical edge connector disposed on the circuit board in communication with the circuitry;
a sensor disposed on the circuit board in communication with the circuitry;
a heat sink disposed on the circuit board in cooperation with the circuitry;
a polymeric material surrounding a portion of the circuit board, wherein the polymeric material protects the circuitry of the circuit board, while allowing the electrical edge connector, the sensor, and the heat sink to function, and wherein the polymeric material surrounding the sensor defines a first seal, the circuit board is capable of being used with an engine control system device in fluid communication with a pressure passage of a throttle body having a measurable parameter therein, and the first seal cooperates with the device to provide a substantially contaminant free environment between the sensor and the measurable parameter.

11. The electronic apparatus of claim 10, wherein the sensor is a pressure sensor.

12. The electronic apparatus of claim 10, wherein the polymeric material near the electrical edge connector defines a second seal, the circuit board is capable of being connected to a wire connector, and the second seal cooperates with the wire connector to provide protection of the electrical edge connector from the surrounding environment.

13. The electronic apparatus of claim 10, further comprising:
an emitter disposed on the circuit board, wherein the emitter is surrounded by the polymeric material and the emitter emits a signal through the polymeric material.

14. The electronic apparatus of claim 10, wherein the electronic apparatus is an engine controller.

* * * * *